(12) United States Patent
Mao et al.

(10) Patent No.: US 10,672,631 B2
(45) Date of Patent: Jun. 2, 2020

(54) METHOD AND SYSTEM FOR SUBSTRATE THINNING

(71) Applicant: Taiwan Semiconductor Manufacturing Co., Ltd., Hsinchu (TW)

(72) Inventors: Yi-Chao Mao, Taoyuan County (TW); Chin-Chuan Chang, Hsinchu County (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/103,933

(22) Filed: Aug. 15, 2018

(65) Prior Publication Data

US 2020/0058520 A1 Feb. 20, 2020

(51) Int. Cl.
*H01L 21/67* (2006.01)
*H01L 23/00* (2006.01)
*H01L 21/683* (2006.01)
*H01L 21/687* (2006.01)
*H01L 21/56* (2006.01)

(52) U.S. Cl.
CPC ........ *H01L 21/6715* (2013.01); *H01L 21/566* (2013.01); *H01L 21/67126* (2013.01); *H01L 21/6838* (2013.01); *H01L 21/68735* (2013.01); *H01L 24/09* (2013.01); *H01L 2224/02371* (2013.01); *H01L 2924/3511* (2013.01)

(58) Field of Classification Search
CPC .............. H01L 21/6715; H01L 21/566; H01L 21/67126; H01L 21/68735; H01L 24/09; H01L 21/6838; H01L 2224/02371; H01L 2924/3511
See application file for complete search history.

(56) References Cited

U.S. PATENT DOCUMENTS

2005/0085008 A1* 4/2005 Derderian ........... H01L 21/6835 438/106
2013/0175700 A1* 7/2013 Chen ....................... H01L 24/94 257/774

FOREIGN PATENT DOCUMENTS

JP  2001038556 A * 2/2001

\* cited by examiner

*Primary Examiner* — Syed I Gheyas
(74) *Attorney, Agent, or Firm* — JCIPRNET

(57) ABSTRACT

A method and a system for thinning a substrate are provided. The method includes at least the following steps. A liquid seal is provided at an interface between a chuck and a substrate disposed on the chuck. The substrate is thinned during the liquid seal is provided.

20 Claims, 22 Drawing Sheets

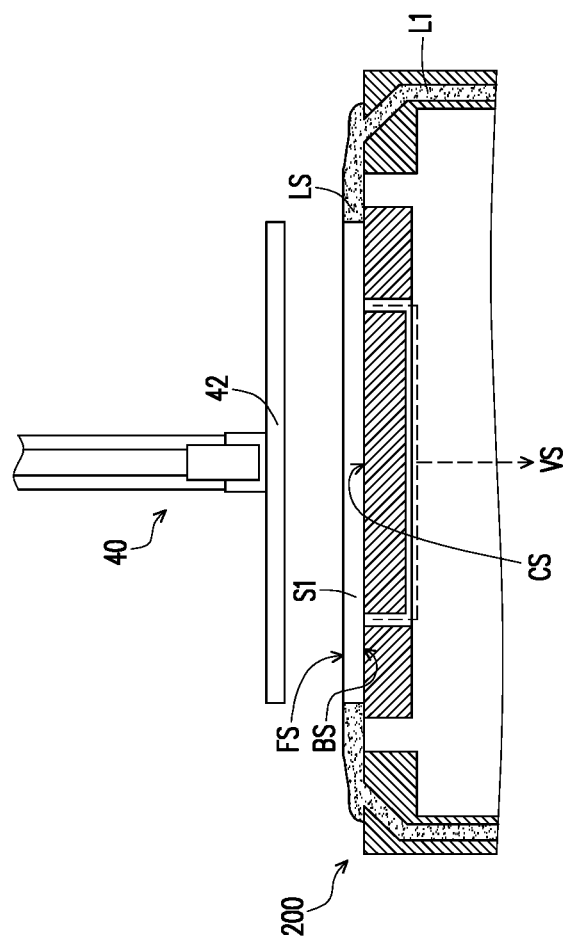

METHOD AND SYSTEM FOR SUBSTRATE THINNING

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. Thus, packages such as wafer level packaging (WLP) have begun to be developed. For example, semiconductor devices are fabricated by sequentially forming various material layers and structures over previously formed layers and structures. Due to varying coefficients of thermal expansion (CTEs) of different materials, thermal issues during the fabrication process may lead to warpage of the semiconductor devices.

Moreover, in the manufacturing of semiconductor devices, a grinding process is performed to reduce the thickness of the structures. As the final thickness of the semiconductor device shrinks, damage caused by the grinding process becomes a bigger concern. For example, in a conventional grinding process, vacuum leakage may occur at the edge of the structure due to warpage. In addition, a grinding process may result in a grinded surface having unacceptable total thickness variation (TTV). Moreover, a structure to be thinned having a smaller thickness is warped at its periphery and becomes easily cracked during the grinding. Furthermore, over-grinding may occur and cause damage to a portion of the structure, thereby leading to yield loss. Therefore, there is a need for an improved method and system for thinning semiconductor devices.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3G are schematic cross-sectional views of various stages in a manufacturing method for thinning a substrate according to some exemplary embodiments of the disclosure.

DETAILED DESCRIPTION

Figure 1A:
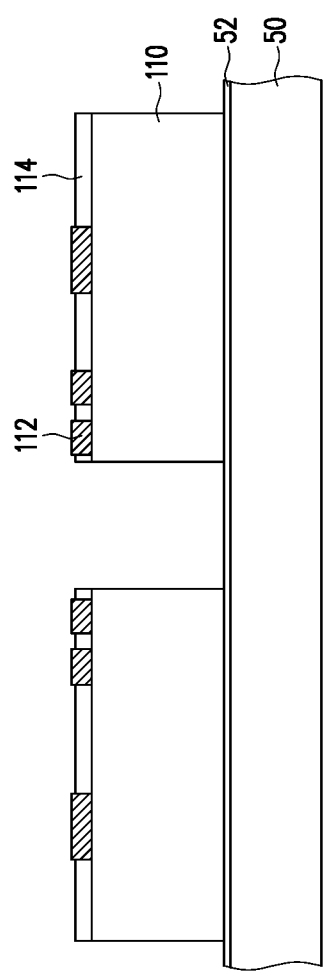
FIG. 1A to FIG. 1H are schematic cross-sectional views of various stages in a manufacturing method of a semiconductor device according to some exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

Figure 1B:
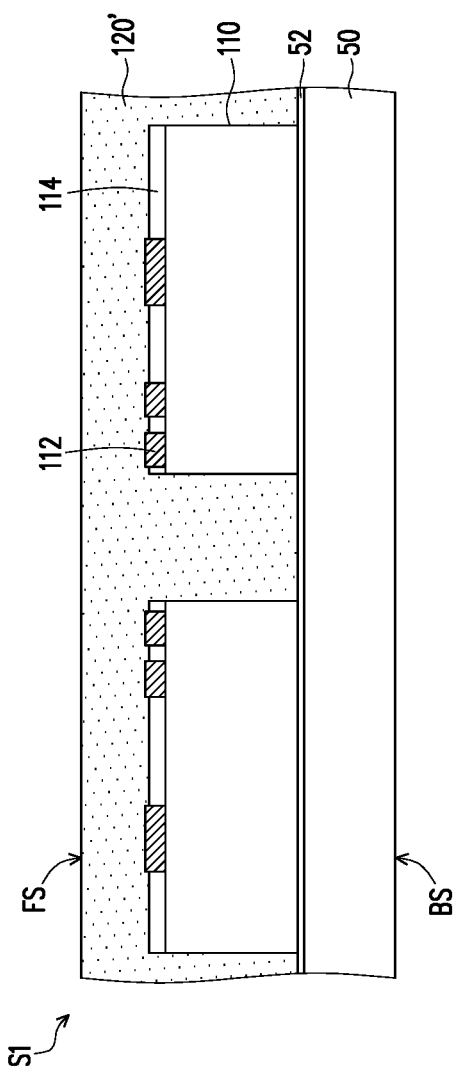
Figure 1C:
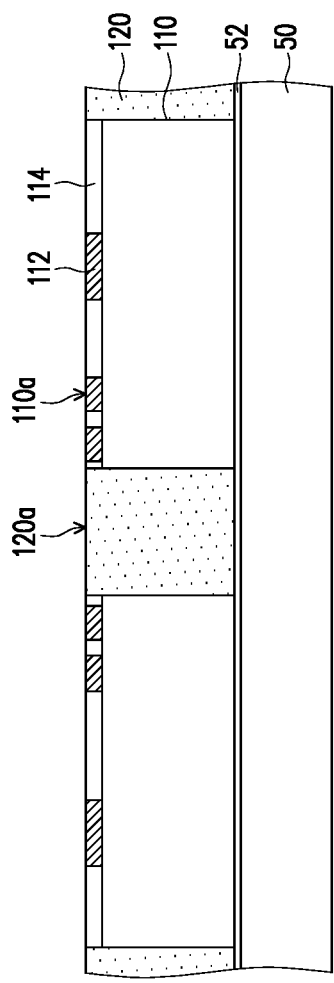
Figure 1D:
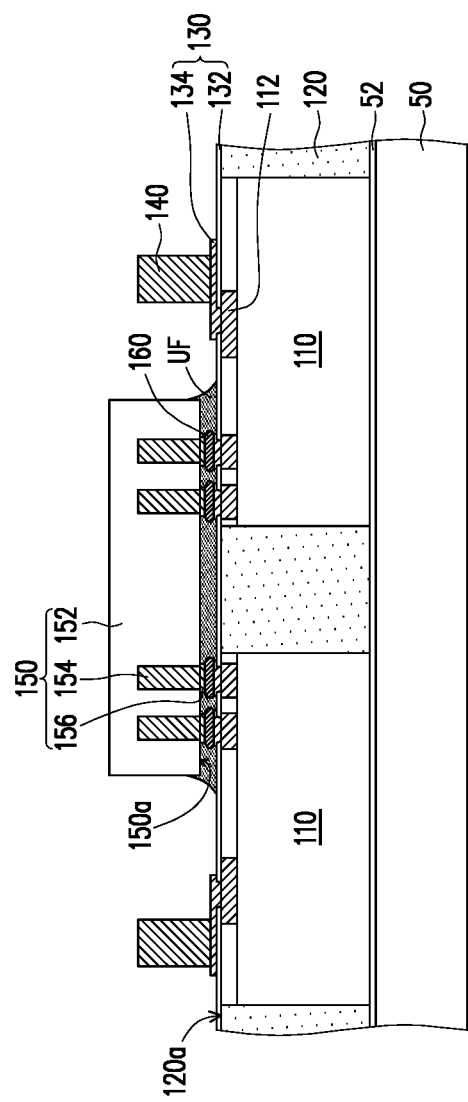
Figure 1E:
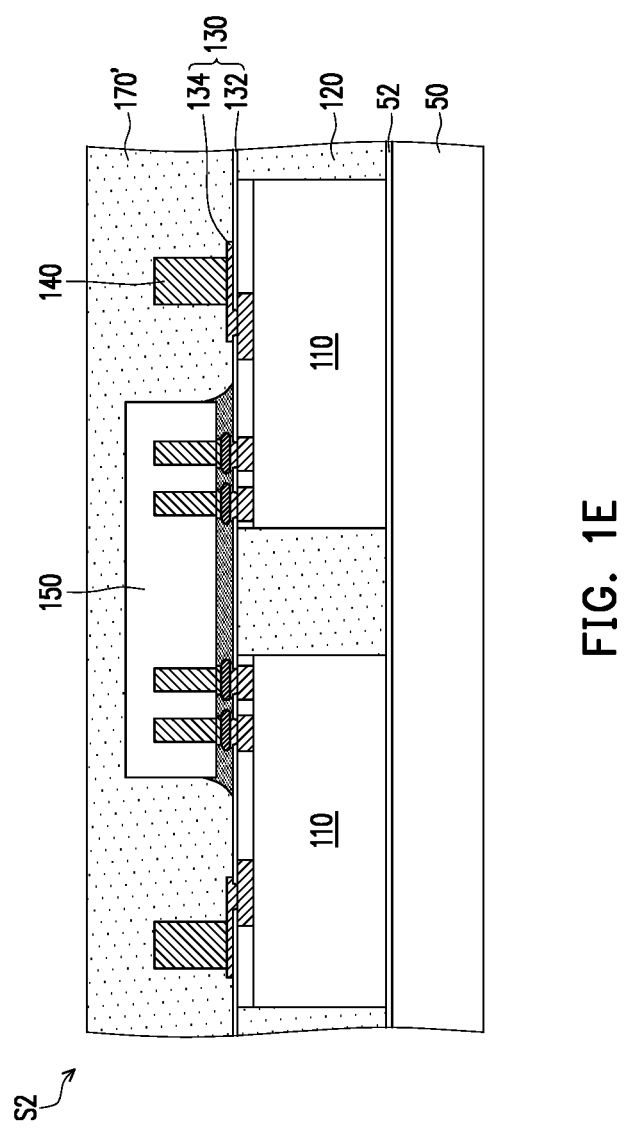
Figure 1F:
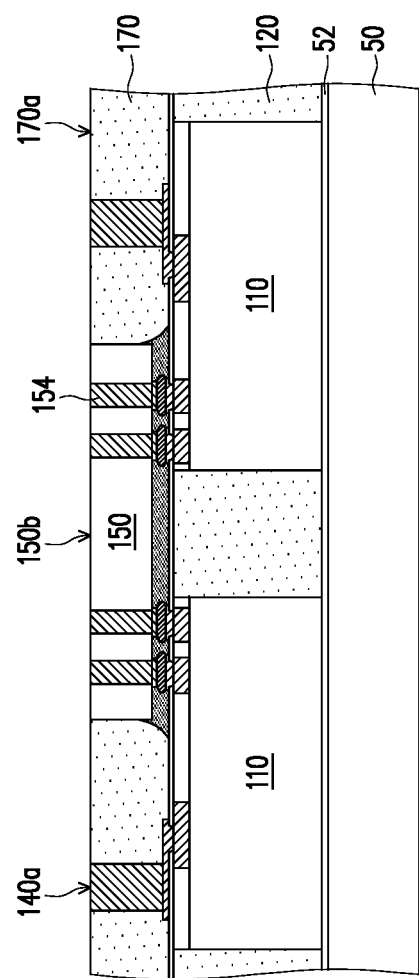
Figure 1G:
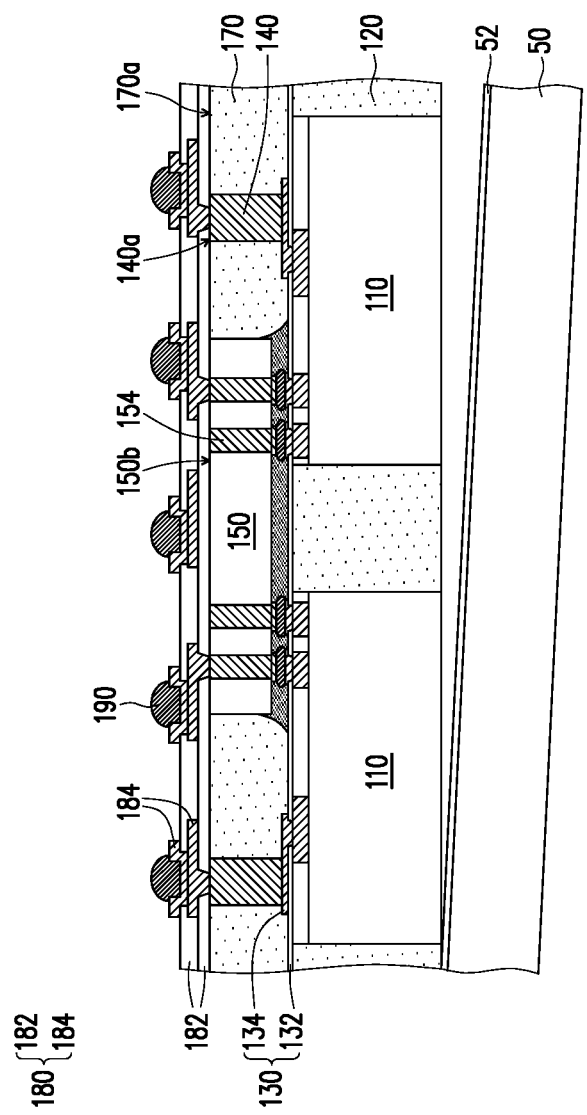
Figure 1H:
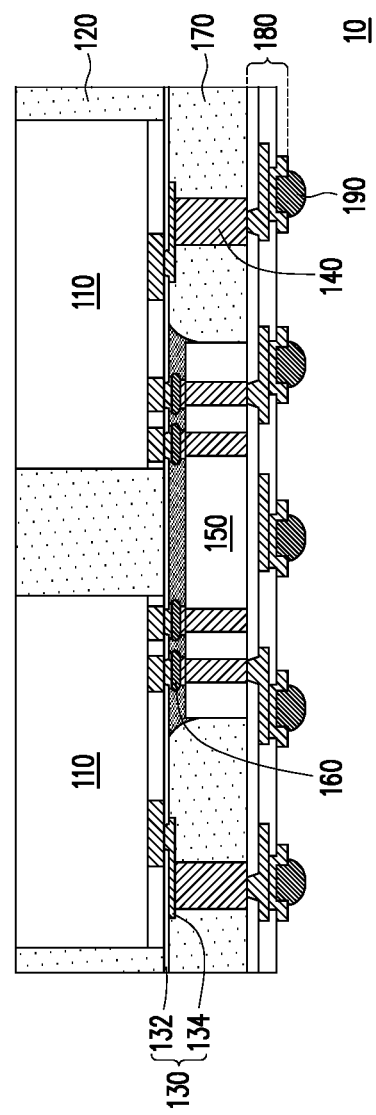
Figure 2:
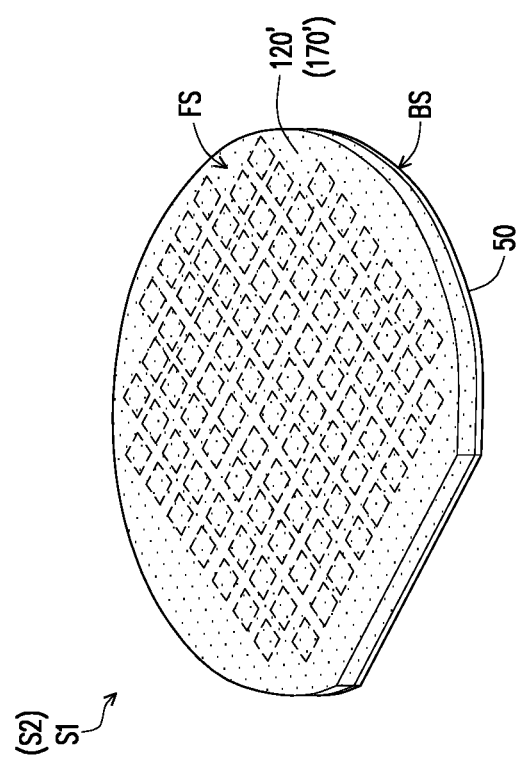
FIG. 2 is a schematic perspective view of the structure depicted in FIG. 1B or FIG. 1E according to some exemplary embodiments of the disclosure.

FIG. 1A to FIG. 1H are schematic cross-sectional views of various stages in a manufacturing method of a semiconductor device according to some exemplary embodiments of the disclosure, and FIG. 2 is a schematic perspective view of the structure depicted in FIG. 1B or FIG. 1E according to some exemplary embodiments of the disclosure. Referring to FIG. 1A, a plurality of first dies 110 are disposed on a substrate carrier 50. In some embodiments, the substrate carrier 50 is a glass carrier, a ceramic carrier, or the like. In some other embodiments, the substrate carrier 50 is a blank silicon wafer that has no integrated circuits formed thereon. The first dies 110 may be adhered on the substrate carrier 50 through a release layer 52. The material of the release layer 52 may be any material suitable for bonding and de-bonding the substrate carrier 50 from the structure subsequently formed thereon. For example, the release layer 52 includes a layer of light-to-heat-conversion (LTHC) release coating and a layer of associated adhesive (e.g., a ultra-violet curable adhesive or a heat curable adhesive layer), or the like.

The first dies 110 may be known-good-dies that are sawed from a device wafer and are selected to be bonded onto the substrate carrier 50. The first dies 110 may be spaced apart from each other on the substrate carrier 50. In some embodiments, the first dies 110 are dies that include active devices (e.g., transistors; not shown). In some embodiments, each of the first dies 110 may include conductive posts 112 and a protection layer 114 covering the conductive posts 112. At least a portion of the conductive posts 112 are exposed by the protection layer 114 for formation of fan-out connections. The conductive posts 112 may be pre-formed in the first dies 110. In some embodiments, the conductive posts 112 include a first subset and a second subset arranged aside the first subset. The design of different layout densities may lead to a size difference between the first and second subset of the conductive posts 112. For example, the size (e.g., width or diameter, etc.) of each conductive post 112 belonging to the first subset is smaller than that of the second subset of the conductive posts 112. The layout density of the first subset of the conductive posts 112 may be greater than the second subset of the conductive posts 112. For example, the conductive posts 112 belonging to the first subset have a tighter spacing therebetween for further fine-pitch electrical connection (e.g., connection of second die 150 as shown in FIG. 1D). The conductive posts 112 belonging to the second subset may have a loosely arrangement for further coarse-pitch electrical connection (e.g., connection of conductive connector 140 as shown in FIG. 1D). In some embodiments, the first dies 110 are arranged in a parallel manner, the first subset of the conductive posts 112 of one of the two adjacent first die 110 is disposed at the side of the first die 110 close to the other one of the two adjacent first die 110, and the second subset of the conductive posts 112 of the one of the two adjacent first die 110 is disposed at the opposite side of the first die 110 away from the other one of the two adjacent first die 110. In some alternative embodiments, the first subset and the second subset of the conductive posts 112 are formed with the same size and/or the same layout density according to the design requirements. For example, the conductive posts 112 includes copper posts, copper alloy posts, or other suitable metal posts, which are electrically coupled to the active devices in the first dies 110. The protection layer 114 may be made of polybenzoxazole (PBO), polyimide (PI), any suitable polymers or inorganic materials. It should be appreciated that the illustration of the first dies 110 and other components throughout all figures is schematic and is not in scale.

Referring to FIG. 1B and FIG. 2, a first insulating material 120' is formed over the substrate carrier 50. For example, the first insulating material 120' is filled into the space between and over the first dies 110 to form a first structure S1. In some embodiments, the first structure S1 may be viewed as a reconstituted wafer as shown in FIG. 2. In some embodiments, the first insulating material 120' is a molding compound formed by a molding process followed by a curing process. For example, the first insulating material 120' is over-molded to encapsulate the first dies 110. The conductive posts 112 and the protection layer 114 of the die 110 are not revealed and well protected by the first insulating material 120'. The first insulating material 120' may include epoxy resin, or other suitable dielectric materials. In some embodiments, thermal treatment (e.g., a curing process) to the first insulating material 120' results in bowing and warpage of the first structure S1.

Referring to FIG. 1C, a thinning process is performed to remove a portion of the first insulating material 120' to form the first insulating encapsulation 120. For example, after forming the first insulating material 120', the first structure S1 is transferred to the next station for thinning. A thickness of the first insulating material 120' may be reduced to reveal at least a portion of the conductive posts 112 of the first dies 110. In some embodiments, the first insulating material 120' is thinned by a mechanical grinding process and/or a chemical mechanical polishing (CMP) process. In some embodiments, the first insulating material 120' is thinned until the top surfaces of the conductive posts 112 and the top surface of the protection layer 114 are exposed. In some embodiments, during the thinning process, not only the first insulating material 120', but also portions of the conductive posts 112 and/or the protection layer 114 are slightly thinned. After thinning the first structure S1, the top surface 120a of the first insulating encapsulation 120 may be substantially coplanar with the top surfaces 110a of the first dies 110. After the conductive posts 112 are exposed, fan-out connections may be formed to electrically connect the conductive posts 112. For example, fan-out connections are the electrical connections extended to an area larger than the area of the first dies 110. The detailed description of a thinning process will be described later accompanying with FIGS. 3A to 3G.

Referring to FIG. 1D, a first redistribution structure 130 and a conductive connector 140 are formed on the top surface 120a of the first insulating encapsulation 120 and the top surfaces 110a of the first dies 110 to electrically couple to the first dies 110. A second die 150 is then mounted on the first redistribution structure 130. For example, the conductive connector 140 may be formed aside the second die 150. The first redistribution structure 130 may include a first dielectric layer 132 and a first patterned conductive layer 134 stacked one another. For example, a dielectric material (e.g., PBO, PI, benzocyclobutene (BCB), or other material that is electrically insulating) is formed over the top surface 120a of the first insulating encapsulation 120 and the top surfaces 110a of the first dies 110 using any suitable method, such as a spin-on coating process, a deposition process, or the like. Next, a portion of the dielectric material is removed to form the first dielectric layer 132 having a plurality of openings (not marked). The openings of the first dielectric layer 132 expose at least a portion of the conductive posts 112 of the dies 110. Next, a conductive material (e.g., copper, copper alloy, aluminum, aluminum alloy, or combinations thereof) is deposited in the openings of the first dielectric layer 132 and over the first dielectric layer 132. Subsequently, the conductive material is patterned to form the first patterned conductive layer 134 using lithography, or other suitable techniques. The portion of the first patterned conductive layer 134 formed in the openings of the first dielectric layer 132 is in physical contact with the conductive posts 112 of the first dies 110. In some embodiments, the abovementioned steps may be performed multiple times to obtain a multi-layered redistribution structure as required by the circuit design. That is, the numbers of the first dielectric layer 132 and the first patterned conductive layer 134 can be selected based on demand and are not limited in the disclosure.

After forming the first redistribution structure 130, the conductive connector 140 may be formed on the first redistribution structure 130. For example, the conductive connectors 140 may be formed by forming a mask pattern (not shown) having openings, where the mask pattern covers a portion of the first redistribution structure 130 and exposes another portion of the first patterned conductive layer 134 with the openings; forming a conductive material to fill the openings so as to form the conductive connector 140 by electroplating or deposition; and then removing the mask pattern. In certain embodiments, the conductive connectors 140 are through integrated fan-out (InFO) vias. After forming the conductive connectors 140, the second die 150 is provided and mounted on the first redistribution structure 130 using, for example, a flip-chip technique and/or surface mount techniques. The number of the second die 150 can be selected based on demand, and is not limited in the disclosure. For example, the second die 150 includes a semiconductor substrate 152, one or more through silicon vias (TSVs) 154 embedded in the semiconductor substrate 152, and connecting pads 156 disposed on the top surface 150*a* of the semiconductor substrate 152. In one embodiment, the semiconductor substrate 152 may be a silicon substrate including active components (e.g., diodes, transistors, or the like) and passive components (e.g., resistors, capacitors, inductors or the like) formed therein. In some embodiments, each of the TSVs 154 has one end connected to one of the connecting pads 156, and the opposite ends of the TSVs 154 are embedded in the semiconductor substrate 152.

In some embodiments, the second die 150 is bonded to the first redistribution structure 130 by forming a plurality of conductive joints 160 between the second die 150 and the first redistribution structure 130. For example, the conductive joints 160 are made of solder materials. The second die 150 is electrically communicated to the first dies 110 through the first redistribution structure 130. In some embodiments, an underfill material UF is formed between the top surface 150*a* of the second die 150 and the first redistribution structure 130 and dispensed around the conductive joints 160. For example, the underfill material UF is disposed on the first redistribution structure 130 and laterally wraps the conductive joints 160 to provide structural support and protection to the conductive joints 160. In some embodiments, the underfill material UF covers the top surface 150*a* and the sidewalls of the second die 150, and exposes the bottom surface of the second die 150, as shown in FIG. 1D.

Referring to FIG. 1E and FIG. 2, after mounting the second die 150, a second insulating material 170' is formed over the first redistribution structure 130. For example, the second insulating material 170' at least fills the gaps among the conductive connectors 140, the second die 150, and the underfill material UF. In some embodiments, the conductive connectors 140, the second die 150 and the underfill material UF are encapsulated in the second insulating material 170' to form a second structure S2 as shown in FIG. 2. A material and a forming process of the second insulating material 170' may be the same as or similar with that of the first insulating material 120', and the detailed descriptions are omitted for brevity. In some alternative embodiments, the underfill material UF is omitted, and the second insulating material 170' is formed using a molded underfill (MUF) process. For example, a MUF material is used as the second insulating material 170', which can provide both the underfill beneath the second die 150 and surrounding the conductive connectors 140, and a protective over-molded second structure S2. In some embodiments, after forming the second insulating material 170', due to varying coefficient of thermal expansions of different materials, the second structure S2 may bow (or warp) upward at the edges (not shown in FIG. 1E).

Referring to FIG. 1F, a thinning process is performed on the second structure S2 to remove a portion of the second insulating material 170' so as to form a second insulating encapsulation 170. The detailed description of a thinning process will be described later accompanying with FIGS. 3A to 3G. In some embodiments, the second insulating material 170' is thinned until the top surfaces 140*a* of the conductive conductors 140 are exposed. In some embodiments, during the thinning process, not only the second insulating material 120', but also portions of the conductive conductors 140 and/or the semiconductor substrate 152 of the second die 150 are slightly thinned. For example, after thinning the second structure S2, a portion of the semiconductor substrate 152 is removed, and the ends of the TSVs 154 which were embedded in the semiconductor substrate 152 may be accessibly reveled by the bottom surface 150*b* of the second die 150. In some embodiments, the pitch between the two adjacent TSVs 154 of the second die 150 may be smaller than the pitch between the two adjacent conductive conductors 140. The size (e.g., width or diameter, etc.) of each conductive conductor 140 may be greater than that of each TSVs 154 of the second die 150. In some embodiments, after performing the thinning process, a top surface 170*a* of the second insulating encapsulation 170 is substantially coplanar with the bottom surface 150*b* of the second die 150 and the top surfaces 140*a* of the conductive conductors 140.

Referring to FIG. 1G, a second redistribution structure 180 and conductive terminals 190 are formed over the top surface 170*a* of the second insulating encapsulation 170, the bottom surface 150*b* of the second die 150 and the top surfaces 140*a* of the conductive conductors 140. The second redistribution structure 180 may include a second dielectric layer 182 and a second patterned conductive layer 184 stacked one another. The numbers of the second dielectric layer 182 and the second patterned conductive layer 184 are not limited in this disclosure. A material and a forming process of the second redistribution structure 180 may be similar with that of the first redistribution structure 130, and the detailed descriptions are simplified. For example, the second dielectric layer 182 including a plurality of openings (not marked) is formed on the top surface 170*a* of the second insulating encapsulation 170, the bottom surface 150*b* of the second die 150 and the top surfaces 140*a* of the conductive conductors 140. The openings of the second dielectric layer 182 may expose at least a portion of the conductive conductors 140 and/or at least a portion of the TSVs 154 of the second die 150. Next, the second patterned conductive layer 184 is formed in the openings of the second dielectric layer 182 and formed on the second dielectric layer 182. In some embodiments, one or more layers of dielectric materials may be represented collectively as the second dielectric layer 182, and conductive features (e.g. conductive lines, conductive pads, and/or conductive vias) are collectively represented as the second patterned conductive layer 184. In some embodiments, a plurality of conductive pads (not marked) may be formed on some of the top surface of the topmost layer of the second patterned conductive layer 184 for electrically connecting with the later-formed components. For example, the conductive pads include under-ball metallurgy (UBM) patterns for a ball mounting process.

After forming the second redistribution structure 180, the conductive terminals 190 are formed thereon for external electrical connection. In some embodiments, the conductive terminals 190 are disposed on the second patterned conductive layer 184 of the second redistribution structure 180 using a ball placement process, a plating process, or other suitable processes. The conductive terminals 190 include solder balls, ball grid array (BGA) balls, or other terminals, but is not limited thereto. Other possible forms and shapes of the conductive terminals 190 may be used according to design requirements. In some embodiments, a soldering process and a reflow process may be optionally performed for enhancement of adhesion between the conductive terminals 190 and the second redistribution structure 180. After forming the conductive terminals 190, the substrate carrier 50 may be removed to expose the first dies 110 and the first insulating encapsulation 120. For example, the substrate carrier 50 is detached through a de-bonding process. In some embodiments, the external energy (e.g., UV laser, visible light or heat) is applied to the release layer 52 so that the carrier 50 can be separated from the first dies 110 and the first insulating encapsulation 120.

Referring to FIG. 1H, after removing the substrate carrier 50, a singulation (or dicing) process may be performed along the cutting lines (not shown) to form a plurality of individual and separated semiconductor devices 10. The singulation process may include mechanical sawing or laser cutting.

Figure 3A:
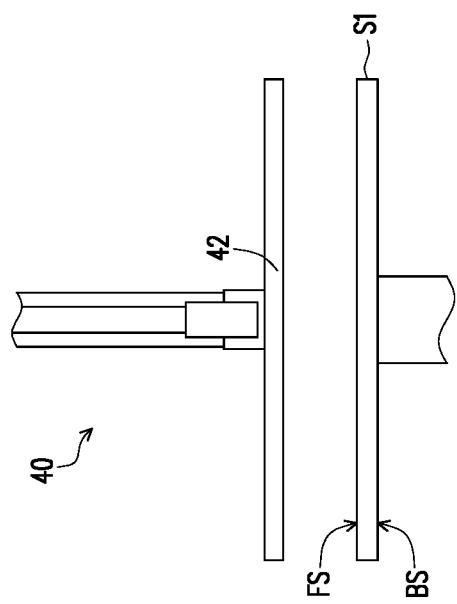
Figure 3B:
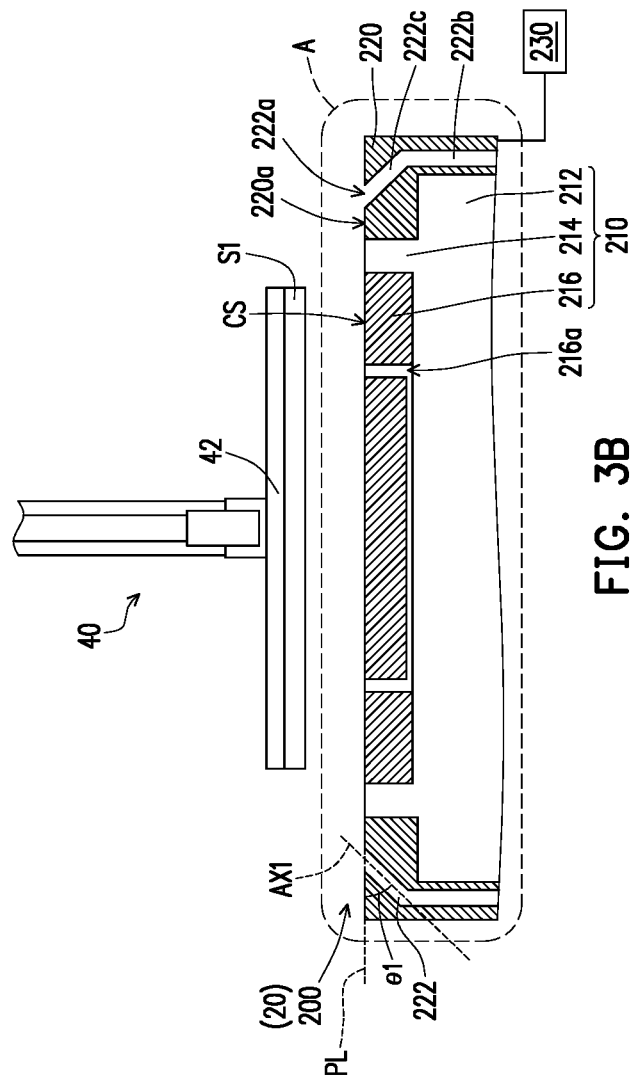
Figure 3C:
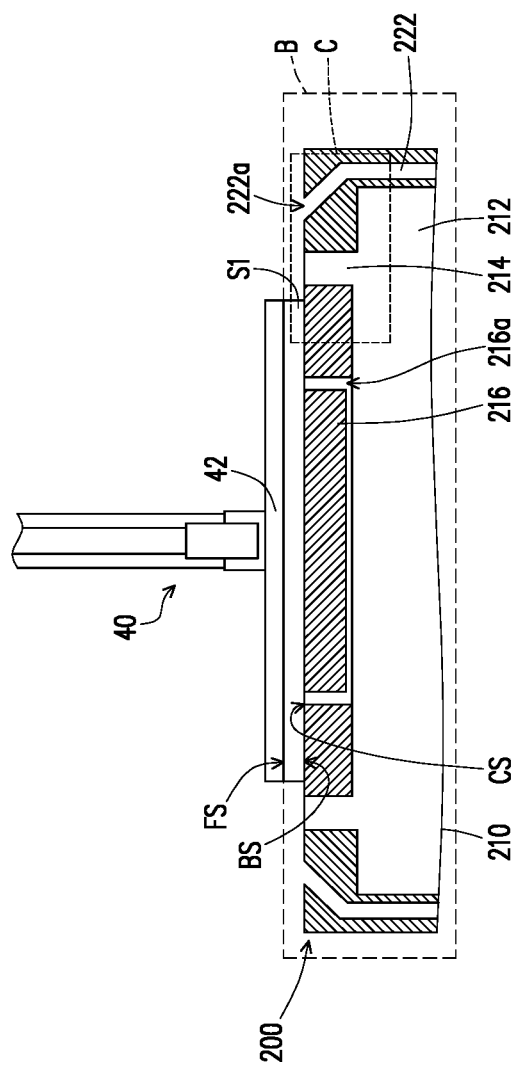
Figure 3D:
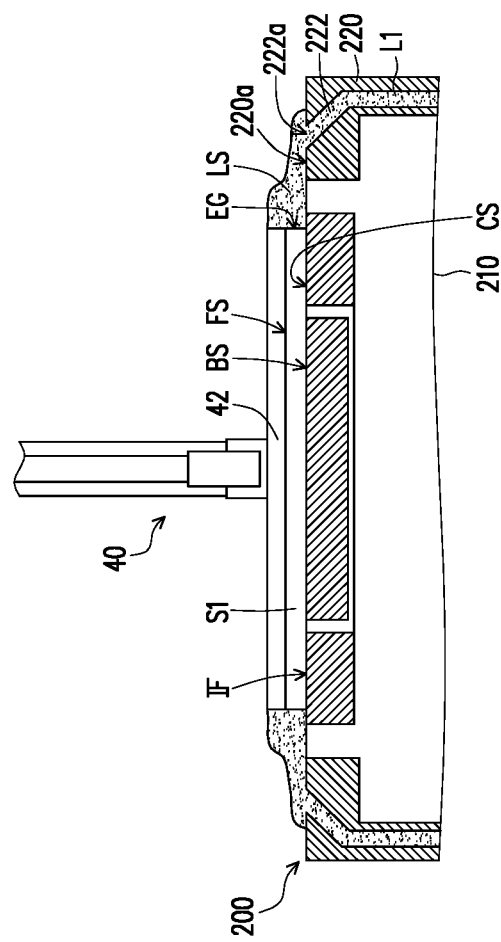
Figure 3E:
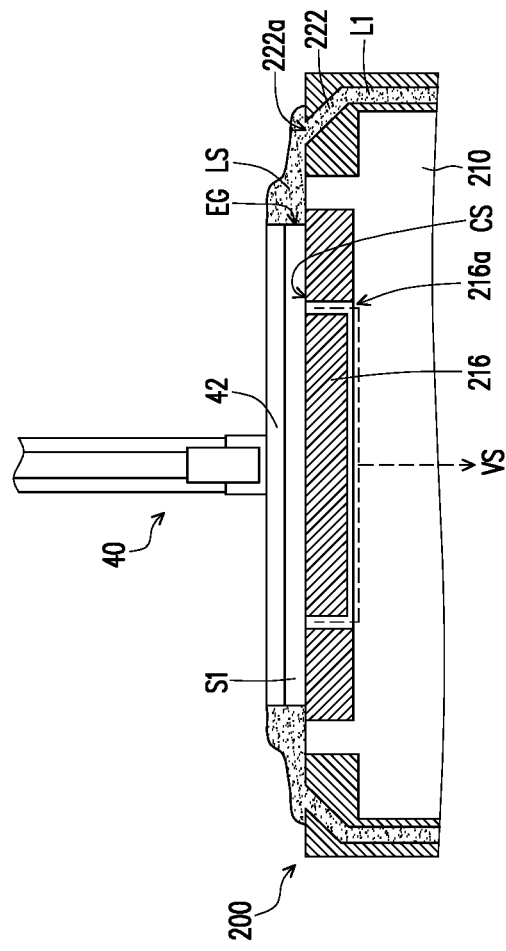
Figure 3G:
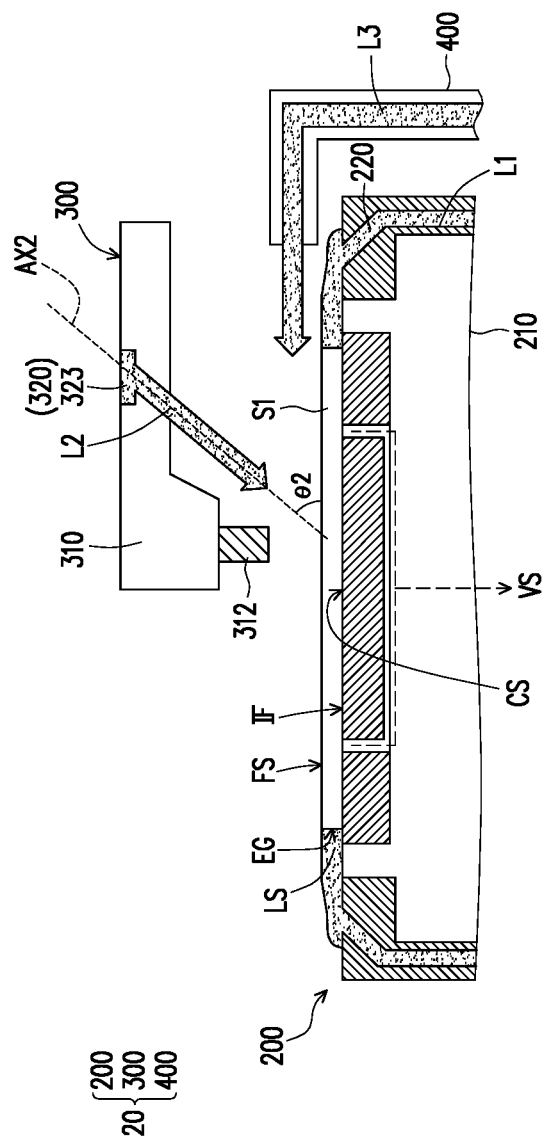
Figure 4:
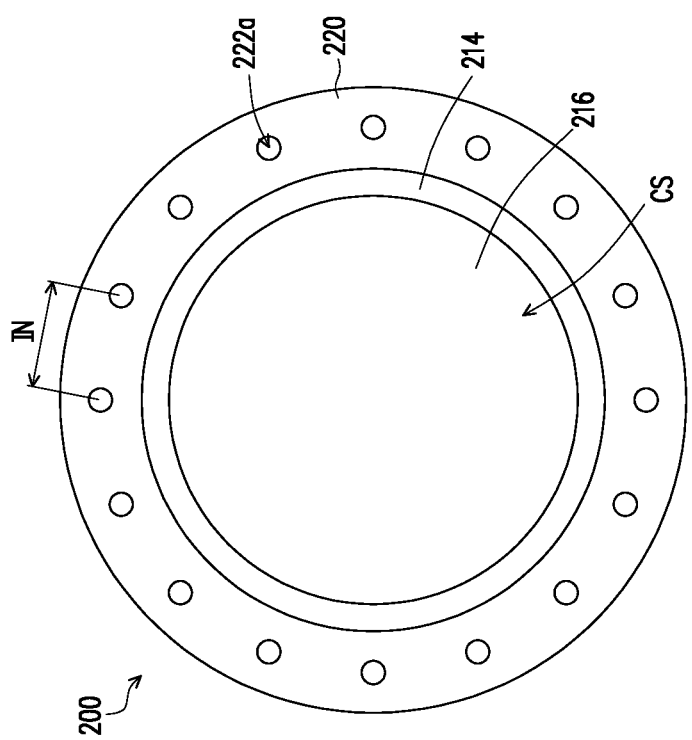
FIG. 4 is a schematic top view of the dashed box A depicted in FIG. 3B according to some exemplary embodiments of the disclosure.

FIG. 3A to FIG. 3G are schematic cross-sectional views of various stages in a manufacturing method for thinning a substrate according to some exemplary embodiments of the disclosure, and FIG. 4 is a schematic top view of the dashed box A depicted in FIG. 3B according to some exemplary embodiments of the disclosure. A method for thinning a substrate is provided in accordance with various embodiments. It is appreciated that the formation of the semiconductor device 10 described in FIG. 1A to FIG. 1H are used as examples. The thinning method in accordance with embodiments herein may be used for thinning other types of objects at various formation stages, for example, backside grinding of silicon wafers, thinning of semiconductor packages at the wafer scale or chip scale, or the like. It should be also noted that a thinning process of the first structure S1 shown in FIG. 1B is described in the following exemplary embodiments. The second structure S2 shown in FIG. 1E can be thinned by the similar thinning steps.

Referring to FIG. 3A to FIG. 3B and FIG. 4 as well as FIG. 1B and FIG. 2, after the first structure S1 is formed, the first structure S1 may be transported to another working stage using a wafer transfer system 40. For example, the wafer transfer system 40 includes a holding device 42 (e.g., robot arm). In some embodiments, vacuum lines (not shown) are provided in the holding device 42, so that the holding device 42 can hold the first structure S1 thereon through vacuum-absorption. The first structure S1 can be secured and transported by the wafer transfer system 40 in other suitable means which can stably hold the structure thereon. The first structure S1 includes a front side FS and a backside BS opposite to the FS. For example, the first insulating material 120' of the first structure S1 shown in FIG. 1B is at the front side FS, and the carrier 50 is at the backside BS. In some embodiments, the wafer transfer system 40 is first positioned to the first structure S1 on the stage for transporting as shown in FIG. 3A. Next, the first structure S1 is picked up from the stage. For example, the front side FS of the first structure S1 is stably held by the holding device 42, and then the first structure S1 is transported to the next station for thinning as shown in FIG. 3B.

Continue to FIG. 3B and FIG. 4, a system 20 for thinning includes a supporting assembly 200. The supporting assembly 200 includes a chuck 210 and a first liquid supply unit 220 assembled on the chuck 210. The chuck 210 including a carrying surface CS is used to support and secure the first structure S1 placed thereon. The first liquid supply unit 220 including a first discharging conduit 222 is used to supply liquid to the first structure S1 during processing. In some embodiments, the first liquid supply unit 220 is detachably assembled onto the outer periphery of the chuck 210, thereby allowing convenient replacement and maintenance works. In some alternative embodiments, the first liquid supply unit 220 and the chuck 210 are integrally-formed. In some embodiments, the chuck 210 includes a base 212, a frame portion 214, and a sucking portion 216. The frame portion 214 and the sucking portion 216 are disposed on the base 212. For example, the base 212 is provided at the bottom of the chuck 210, and the frame portion 214 and the sucking portion 216 are provided at the top of the chuck 210. In some embodiments, the top surface area of the chuck 210 is less than the bottom surface area of the chuck 210. In some alternative embodiments, the top surface area of the chuck 210 is substantially equal to the bottom surface area of the chuck 210. In some embodiments, the base 212 and the frame portion 214 are integrally-formed, and the frame portion 214 is an annular partition on the base 212. The sucking portion 216 may be in disc form and secured inside the frame portion 214. The sucking portion 216 may be in other forms depending on the design requirements.

The sucking portion 216 of the chuck 210 may be made of a porous material (e.g., polymer, ceramic, or the like) or other suitable materials. In some embodiments, a surface of the sucking portion 216 exposed by the frame portion 214 and the base 212 is adapted to carry the first structure S1, so the surface of the sucking portion 216 is viewed as the carrying surface CS of the chuck 210. In some alternative embodiments in which the object to be thinned has a relatively larger size, the surface of the sucking portion 216 and the surface of the frame portion 214 surrounding the surface of the sucking portion 216 are viewed as the carrying surface CS of the chuck 210. In some embodiments, the sucking portion 216 includes an air passage 216a. For example, the sucking portion 216 may be connected to a vacuum system (not shown). After the first structure S1 is placed on the chuck 210 and when the chuck 210 is in use, air can be sucked out from inside the sucking portion 216 through the air passage 216a, so that the first structure S1 placed on the carrying surface CS of the chuck 210 can be sucked and secured. The chuck 210 may be equipped with any suitable securing mechanism for holding the structure placed thereon. It should be noted that the vacuum system of the chuck 210 serves merely as one of exemplary means to secure the first structure S1, and other suitable means (e.g., applying mechanical force) of securing the first structure S1 are considered within the scope of other embodiments. It is appreciated that the illustration of the chuck 210 and other components throughout the figures are schematic and some components are omitted. For example, the chuck 210 may be provided with a rotation mechanism (e.g., shaft, motor, controller, or the like; not shown), thereby allowing rotation around the center axis of the sucking portion 216 as the center.

In some embodiments, the first liquid supply unit 220 may be engaged with the base 212 and/or the frame portion 214 of the chuck 210. For example, the first liquid supply unit 220 is made of non-wetting materials (e.g., plastic, rubber, or the like), or other suitable materials. In some embodiments, the first liquid supply unit 220 is an annular-shaped component mounted on the periphery of the chuck 210. For example, the first liquid supply unit 220 is attached on the periphery of the base 212 and is concentric with the frame portion 214. The first liquid supply unit 220 may be a rim having other suitable shapes (e.g., rectangular, polygon, or the like) fitting closely to the chuck 210. The first discharging conduit 222 of the first liquid supply unit 220 may be disposed surrounding the frame portion 214 of the chuck 210 and obliquely towards the carrying surface CS. For example, the first discharging conduit 222 is disposed at an inclined angle to the annular sidewall of the frame portion 214. In some embodiments, a plane PL where the carrying surface CS is located intersected with an inclined axis AX1 of the first discharging conduit 222 forms an included angle θ1. The included angle θ1 may be in a range of about 10 degrees to about 80 degrees. In some alternative embodiments, the plane PL is substantially parallel to the axis AX1 of the first discharging conduit 222.

The first discharging conduit 222 is adapted to convey a liquid discharging from an outlet 222a of the first discharging conduit 222 towards the carrying surface CS of the chuck 210. The outer diameter (or width) of the outlet 222a of the first discharging conduit 222 is in a range of about 1 mm to about 4 mm. In some embodiments, the first liquid supply unit 220 includes a plurality of first discharging conduits 222, and each of the first discharging conduits 222 has the outlet 222a (i.e. opening). The outlets 222a of the first discharging conduits 222 may be evenly distributed around the frame portion 214 of the chuck 210. For example, the outlets 222a of the first discharging conduits 222 are set in at substantially equal intervals IN as a means to present a more uniform liquid supply. In some alternative embodiments, the adjacent outlets 222a are spaced at different intervals IN. In some embodiments, the outlets 222a of the first discharging conduits 222 are circumferentially distributed surrounding the carrying surface CS of the chuck 210 as shown in FIG. 4. It should be noted that the round-shaped outlet 222a illustrated in FIG. 4 merely serves as an example, other shaped outlet (e.g., square-shaped, oval-shaped, rectangular-shaped, or the like) of the first discharging conduit 222 may be applied. In some embodiments, a surface 220a (e.g., where the outlet 222a is located) of the first liquid supply unit 220 is substantially leveled with the carrying surface CS of the chuck 210.

In some alternative embodiments, the surface 220a of the first liquid supply unit 220 and the carrying surface CS of the chuck 210 are not at the same level. For example, the surface 220a of the first liquid supply unit 220 is slightly higher or lower than the carrying surface CS of the chuck 210 depending on design requirements. In some embodiments, the number of the outlets 222a (or the first discharging conduits 222) is equal or greater than 16. More or less number of the outlets 222a (or the first discharging conduits 222) can be configured depending on design requirements, which is not limited in the disclosure.

Figure 5:
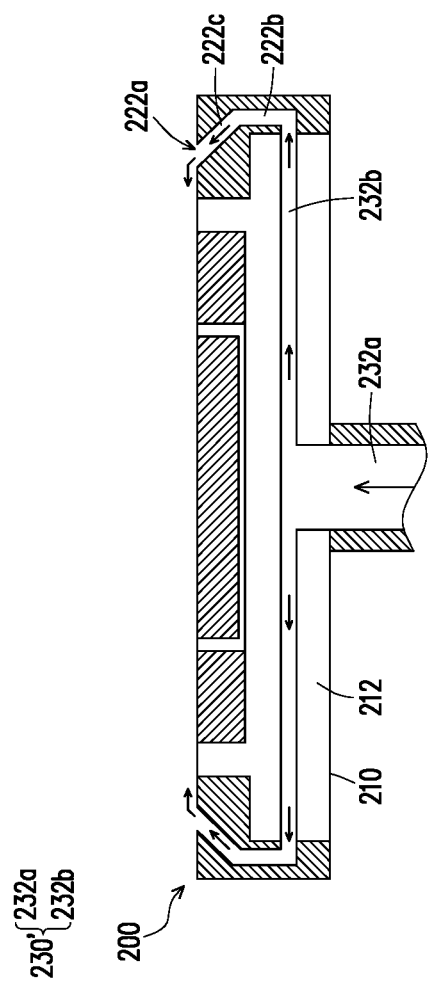
FIG. 5 and FIG. 6 are schematic cross-sectional views illustrating a liquid supply of a system for thinning a substrate according to some exemplary embodiments of the disclosure.
Figure 6:
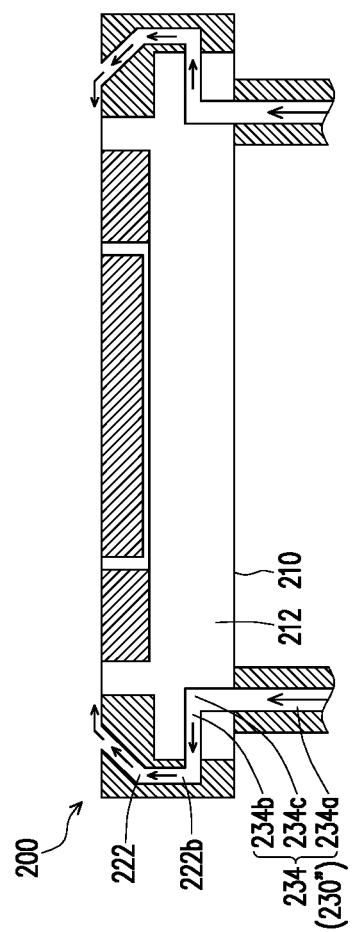

FIG. 5 and FIG. 6 are schematic cross-sectional views illustrating a liquid supply of a system for thinning a substrate according to some exemplary embodiments of the disclosure. Continue to FIG. 3B with reference to FIG. 5 and FIG. 6, the first discharging conduit 222 includes a vertical segment 222b and an inclined segment 222c in communication with the vertical segment 222b. In some embodiments, the first liquid supply unit 220 further includes a liquid supply 230 in communication with the first discharging conduits 222 of the first liquid supply unit 220. A liquid control system (e.g., pump, valve, controller, or the like; not shown) may be connected to the liquid supply 230 and/or the chuck 210 and/or the first liquid supply unit 220 for the control of the liquid conveying from the liquid supply 230, passing through the chuck 210, and discharging from the outlets 222a of the first liquid supply unit 220. In some embodiments, the liquid supply 230 is an external liquid delivery system coupled to the first liquid supply unit 220.

In some embodiments, the liquid supply 230' includes a main channel 232a disposed in the center of the chuck 210, and a plurality of branch channels 232b in communication with the main channel 232a and extending across the chuck 210 to connect the vertical segment 222b of the first discharging conduits 222 as shown in FIG. 5. For example, the main channel 232a of the liquid supply 230 is vertically disposed inside the center of the base 212. The branch channels 232b connected to the main channel 232a are horizontally distributed inside the base 212 and laterally penetrate through the base 212. The number of the branch channels 232b may correspond to that of the first discharging conduits 222. The liquid may be conveyed upwardly (as shown by arrows in FIG. 5) through the main channel 232a and distributed to the branch channels 232b; next, the liquid may be delivered from the center to the periphery of the base 212 of the chuck 210, and then the liquid discharges out of the chuck 210 and flows into the vertical segments 222b of the first discharging conduits 222. Subsequently, the liquid is delivered to the inclined segments 222c and discharges out from the outlets 222a.

In some embodiments, the liquid supply 230" is split into a plurality of ducts 234 disposed inside at the periphery of the base 212 of the chuck 210 as shown in FIG. 6. The number of the ducts 234 may correspond to that of the first discharging conduits 222. Each of the ducts 234 may include a vertical segment 234a, a horizontal segment 234b connected to one of the vertical segments 222b of the first discharging conduits 222, and a turning segment 234c connected to the vertical segment 234a and the horizontal segment 234b. For example, the liquid may be conveyed upwardly (as shown by arrows in FIG. 6) in the vertical segment 234a to the turning segment 234c then to the horizontal segment 234b. The liquid subsequently discharges out of the chuck 210 and flows into the vertical segments 222b of the first discharging conduits 222.

Figure 7:
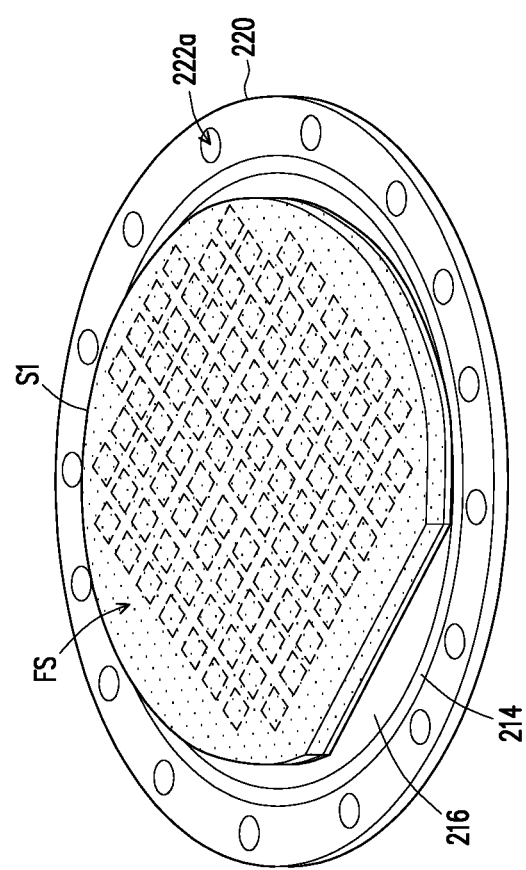
FIG. 7 is a schematic perspective view of the dashed box B depicted in FIG. 3C according to some exemplary embodiments of the disclosure.
Figure 8:
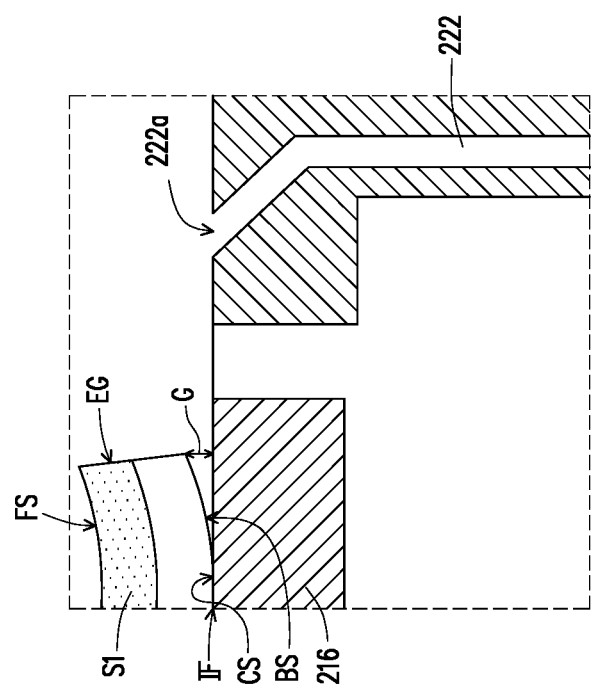
FIG. 8 is an enlarged, schematic cross-sectional view of the dashed box C depicted in FIG. 3C according to some exemplary embodiments of the disclosure.

FIG. 7 is a schematic perspective view of the dashed box B depicted in FIG. 3C according to some exemplary embodiments of the disclosure, and FIG. 8 is an enlarged, schematic cross-sectional view of the dashed box C depicted in FIG. 3C according to some exemplary embodiments of the disclosure. Turning to FIG. 3C with reference to FIG. 7 and FIG. 8, the first structure S1 is placed on the chuck 210 of the supporting assembly 200 by the wafer transfer system 40. For example, the first structure S1 is put on the carrying surface CS of the chuck 210. At this step, the holding device 42 of the wafer transfer system 40 still secures the front side FS of the first structure S1, and the backside BS of the first structure S1 faces toward the sucking portion 216 of the chuck 210 as shown in FIG. 3C. The air passage 216a may be covered by the first structure S1. In some embodiments, the sucking portion 216 of the chuck 210 may be partially exposed by the first structure S1 disposed thereon, and the outlets 222a of the first discharging conduits 222 are distributed surrounding the first structure S1 as shown in FIG. 7. In some embodiments, after disposing the first structure S1 on the chuck 210, the backside BS of the first structure S1 is partially contact with the carrying surface CS of the chuck 210. The area of an interface IF between the backside BS of the first structure S1 and the carrying surface CS may be smaller than the area of the backside BS of the first structure S1. A gap G may be formed between at the edge EG of the first structure S1 and the carrying surface CS of the chuck 210 due to warpage at the edge EG of the first structure S1 as shown in FIG. 8.

Referring to FIG. 3D, after disposing the first structure S1 on the chuck 210, a liquid seal LS is provided at the interface IF between the chuck 210 and the first structure S1. For example, a first liquid L1 is provided and laterally flows to the edge EG of the first structure S1 so as to seal the gap G (marked in FIG. 8) between the chuck 210 and the first structure S1. In other words, the gap G between the chuck 210 and the first structure S1 is filled with the first liquid L1 provided by the first liquid supply unit 220 to seal the interface IF between the first structure S1 and the carrying surface CS of the chuck 210. When the first liquid supply unit 220 delivers the first liquid L1, the first liquid L1 flows upwardly through the first discharging conduits 222 and discharges from the outlets 222a on the surface 220a to the edge EG of the first structure S1, so that the first liquid L1 may continuously flow on the carrying surface CS so as to provide a seal to the interface IF between the first structure S1 and the carrying surface CS. The first liquid L1 may be water, a liquid having a relatively neutral pH, or other suitable fluids, which not causes damage to the first structure S1. The pressure and velocity of the flowing first liquid L1 providing by the liquid supply 230 may be adjusted by the liquid control system (not shown) based on design requirements.

Referring to FIG. 3E, vacuum suction VS (as shown by dashed arrow) is performed to the first structure S1 through the chuck 210. The vacuum causes the first structure S1 to secure firmly onto the carrying surface CS of the chuck 210. In some embodiments, the vacuum suction VS is performed after providing the liquid seal LS. In some alternative embodiments, the vacuum suction VS is performed after disposing the first structure S1 and prior to providing the liquid seal LS. For example, the vacuum suction VS is applied in the center region of the supporting assembly 200 and the first liquid L1 is provided in the periphery region of the supporting assembly 200. When the vacuum suction VS is applied, a portion of the first liquid L1 may be drawn by vacuum pressure and may enter the sucking portion 216 and then drain to the air passage 216a in the sucking portion 216. In some embodiments, after applying the vacuum suction VS and providing the liquid seal LS, the step of assessing vacuum leakage may be performed by measuring vacuum suction pressure. For example, if the edge EG of the first structure S1 is appropriately sealed by the first liquid L1, a relatively constant suction pressure can be maintained, thereby ensuring a reliable liquid seal at the edge EG of the first structure S1.

Referring to FIG. 3F, after the vacuum suction VS is applied, the holding device 42 of the wafer transfer system 40 is removed to release the first structure S1 so that the front side FS of the first structure S1 is exposed. For example, after the liquid seal LS is provided, the vacuum suction VS is applied and followed by releasing the holding device 42. In some alternative embodiments, when the wafer transfer system 40 reaches the processing station, the first structure S1 held on the holding device 42 is placed on the carrying surface CS of the chuck 210 and secured by means of the vacuum suction VS, and then the holding device 42 is removed by releasing vacuum-absorption to the front side FS of the first structure S1. During the vacuum suction VS is applied, vacuum leakage may occur at the edge EG of the first structure S1 due to warpage, so the first liquid L1 is provided to seal the edge of the first structure S1.

Figure 9:
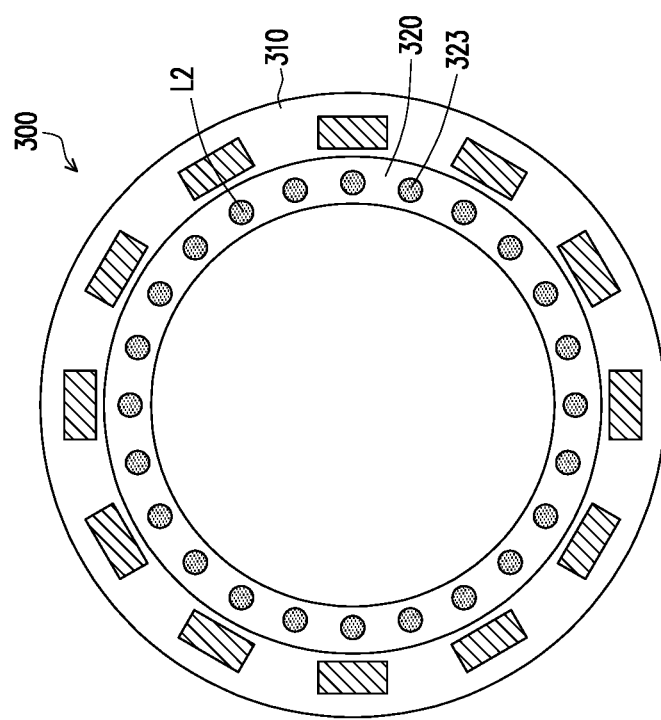
FIG. 9 is a schematic bottom view illustrating a thinning device according to some exemplary embodiments of the disclosure.

FIG. 9 is a schematic bottom view illustrating a thinning device according to some exemplary embodiments of the disclosure. Turning to FIG. 3G with reference to FIG. 9, the first structure S1 is thinned by a thinning device 300 during the liquid seal LS is provided. In some embodiments, when the first structure S1 is thinned, vacuum suction VS is continuously applied through the chuck 210 so as to secure the first structure S1. In some embodiments, the thinning device 300 disposed above the chuck 210 includes a thinning wheel 310 and a second liquid supply unit 320 surrounded by the thinning wheel 310. The first structure S1 is machined to have a predetermined thickness by the rotation of the thinning wheel 310. For example, the thinning wheel 310 includes a plurality of grinding pads 312 circumferentially disposed on the thinning wheel 310 for grinding or smoothing the first structure S1. The grinding pads 312 can be applied to the front side FS of the first structure S1 for rough grinding and/or polishing. In some embodiments, a second liquid L2 is provided downwardly from the second liquid supply unit 320 of the thinning device 300 to the front side FS of the first structure S1 when thinning the first structure S1. The thinning device 300 may further include a control unit (not shown) coupled to the thinning wheel 310 and the second liquid supply unit 320 for controlling the action of thinning wheel 310 and the amount of the second liquid L2. During the thinning process, the thinning wheel 310 and the first structure S1 both rotate. When the first structure S1 is spinning, a portion of the first liquid L1 provided by the first liquid supply unit 220 may be thrown away by centrifugal force from the chuck 210.

In some embodiments, the second liquid supply unit 320 includes a plurality of second discharging conduits 323 obliquely disposed towards the grinding pads 312 for spraying the second liquid L2 to the first structure S1. For example, the axes AX2 of the second discharging conduits 323 intersected with the surface of the front side FS of the first structure S1 forms an acute angle θ2. The second liquid supply unit 320 may include another liquid supply system (not shown) different from the liquid supply 230 of the supporting assembly 200. The second liquid L2 may be water, a liquid having a relatively neutral pH, or other suitable fluids depending on the process requirements. In some embodiments, the second liquid supply unit 320 is used to provide water rinse during the thinning process. In some embodiments, the system 20 may further include a nozzle 400 disposed aside the supplying assembly 200 for providing a third liquid L3 from a different direction with respect to the second discharging conduits 323 of the second liquid supply unit 320. The third liquid L3 may be water, detergent, or other suitable fluids for processing. In some embodiments, the third liquid L3 discharges from the nozzle 400 may rinse away residuals (or any remaining dusts) on the grinded surface of the first structure S1 to minimize the generation of contaminants. For example, the second liquid L2 flowing through the second discharging conduits 323 sprays obliquely downward (as shown by arrow) to the front side FS of the first structure S1, and the third liquid L3 flowing through the nozzle 400 laterally sprays toward (as shown by arrow) the front side FS of the first structure S1. A drying step is optionally performed followed by the thinning.

Since the edge EG of the first structure S1 is sealed with the first liquid L1, vacuum leakage at the edge EG is eliminated, and the interface IF between the first structure S1 and the carrying surface CS of the chuck 210 is remained at a vacuumed state, thereby facilitating warpage management. Due to the liquid seal LS at the edge EG of the first structure S1, the suction force may be uniform throughout the sucking portion 216 of the chuck 210 or may be distributed at a desired condition, thereby eliminating over-grinding concerns. The first structure S1 can be firmly secured on the chuck 210 during the thinning process. After the first structure S1 is thinned, at least a portion of the conductive feature (e.g. conductive posts 112) of the first structure S1 is exposed by the first insulating encapsulation 120 as shown in FIG. 1C. In some embodiments, after thinning the first structure S1, the top surface 120a of the first insulating encapsulation 120 and the top surfaces 110a of the first dies 110 (shown in FIG. 1C) have planar topographies. For example, total thickness variation (TTV) is a measure of surface uniformity. After the first structure S1 is thinned, a total thickness variation of the thinned surface at the front side FS of the first structure S1 may achieve less than 1 μm.

When the thinning process is completed, the thinned structure may be picked up and transported to the next station for subsequent processes.

According to some embodiments, a manufacturing method of thinning a substrate is provided. The method includes at least the following steps. A liquid seal is provided at an interface between a chuck and a substrate disposed on the chuck. The substrate is thinned during the liquid seal is provided.

According to some embodiments, a manufacturing method of thinning a semiconductor structure is provided. The method includes at least the following steps. A semiconductor structure is formed, where the semiconductor structure includes a first semiconductor die and a first insulating encapsulation encapsulating the first semiconductor die. The semiconductor structure is placed on a supporting assembly, where the supporting assembly includes a chuck and a first liquid supply unit assembled on the chuck. A gap between the chuck and the semiconductor structure is filled with a first liquid provided by the first liquid supply unit. The semiconductor structure is thinned during the first liquid is provided.

According to some embodiments, a system for thinning a substrate includes a chuck including a carrying surface, and a first liquid supply unit assembled on the chuck. The first liquid supply unit includes a discharging conduit obliquely disposed toward the chuck, where the discharging conduit conveys a liquid flowing from at least one outlet of the discharging conduit towards the carrying surface of the chuck to seal an interface between the substrate and the carrying surface.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A manufacturing method of thinning a substrate, comprising:
   providing a liquid seal at an interface between a top of a chuck and a substrate disposed on the chuck, wherein a first liquid flows from a bottom of the chuck to the top of the chuck so as to provide the liquid seal; and
   thinning the substrate during the liquid seal is provided.

2. The manufacturing method according to claim 1, wherein providing the liquid seal comprises:
   laterally providing the first liquid to an edge of the substrate to seal a gap between the chuck and the substrate.

3. The manufacturing method according to claim 1, further comprising:
   performing vacuum suction to the substrate through the chuck when the substrate is thinned.

4. The manufacturing method according to claim 1, further comprising:
   providing a second liquid downwardly to the substrate when thinning the substrate.

5. The manufacturing method according to claim 1, further comprising:
   transferring the substrate to place on the chuck via a holding device before providing the liquid seal; and
   releasing the substrate from the holding device before thinning the substrate.

6. The manufacturing method according to claim 1, wherein the substrate comprises an insulating encapsulation and a conductive feature covered by the insulating encapsulation, and after the substrate is thinned, at least a portion of the conductive feature of the substrate is exposed by the insulating encapsulation.

7. A manufacturing method for thinning a semiconductor structure, comprising:
   forming a semiconductor structure, wherein the semiconductor structure comprises a first semiconductor die and a first insulating encapsulation encapsulating the first semiconductor die;
   placing the semiconductor structure on a supporting assembly, wherein the supporting assembly comprises a chuck and a first liquid supply unit laterally encircling the chuck;
   filling a gap between the chuck and the semiconductor structure with a first liquid, wherein the first liquid is delivered by the first liquid supply unit from a bottom of the chuck to a top of the chuck; and
   thinning the semiconductor structure during the first liquid is provided.

8. The manufacturing method according to claim 7, wherein when filling the gap between the chuck and the semiconductor structure, the first liquid discharges from the first liquid supply unit and laterally flows to an edge of the semiconductor structure.

9. The manufacturing method according to claim 7, wherein the first liquid supply unit comprises a conduit obliquely disposed on the chuck, when the first liquid supply unit provides the first liquid, the first liquid flows upwardly through the conduit and discharges to an edge of the semiconductor structure.

10. The manufacturing method according to claim 7, wherein the semiconductor structure is thinned via a thinning device, and the thinning device comprises a thinning wheel and a second liquid supply unit surrounded by the thinning wheel, and the method further comprises:
    flowing a second liquid downwardly to the semiconductor structure via the second liquid supply unit when the semiconductor structure is thinned.

11. The manufacturing method according to claim 7, wherein
    the first semiconductor die of the semiconductor structure comprises a conductive feature covered by the first insulating encapsulation before thinning, and
    after thinning the semiconductor structure, at least a portion of the conductive feature of the first semiconductor die is accessibly revealed by the first insulating encapsulation.

12. The manufacturing method according to claim 7, wherein
    the semiconductor structure further comprises a redistribution structure formed on the first semiconductor die and the first insulating encapsulation, a second semiconductor die disposed on the redistribution structure opposite to the first semiconductor die, a conductive connector formed on the redistribution structure and aside the second semiconductor die, and a second insulating encapsulation formed on the redistribution structure and encapsulating the second semiconductor die and the conductive connector, and after thinning the semiconductor structure, at least a portion of the conductive connector is accessibly revealed by the second insulating encapsulation.

13. The manufacturing method according to claim 12, wherein
the second semiconductor die of the semiconductor structure comprises a semiconductor substrate and a conductive via, the conductive via comprises one end embedded in the semiconductor substrate, and
after thinning the semiconductor structure, at least a portion of the semiconductor substrate is removed, and the one end of the conductive via is accessibly revealed by the semiconductor substrate.

14. A system for thinning a substrate, comprising:
a chuck comprising a carrying surface; and
a first liquid supply unit laterally encircling the chuck, and comprising:
a discharging conduit obliquely disposed toward the chuck, wherein the discharging conduit conveys a liquid flowing from a bottom of the chuck to a top of the chuck and the liquid discharges from at least one outlet of the discharging conduit towards the carrying surface of the chuck to seal an interface between the substrate and the carrying surface.

15. The system according to claim 14, wherein a surface of the first liquid supply unit where the at least one outlet of the discharging conduit is located is substantially leveled with the carrying surface of the chuck.

16. The system according to claim 14, wherein the at least one outlet comprises a plurality of openings circumferentially distributed surrounding the carrying surface of the chuck.

17. The system according to claim 14, wherein the chuck further comprises a frame portion comprising a recess, and a sucking portion disposed in the recess of the frame portion, the substrate is adapted to place on the sucking portion, and the first liquid supply unit is engaged with the frame portion.

18. The system according to claim 14, further comprising:
a liquid supply, disposed in a center of the chuck and being in communication with the discharging conduit.

19. The system according to claim 14, further comprising:
a liquid supply, disposed in a periphery of the chuck and being in communication with the discharging conduit.

20. The system according to claim 14, further comprising:
a thinning device disposed above the chuck, and comprising a thinning wheel and a second liquid supply unit surrounded by the thinning wheel.

* * * * *